US007970153B2

(12) United States Patent
Konagai et al.

(10) Patent No.: US 7,970,153 B2
(45) Date of Patent: Jun. 28, 2011

(54) AUDIO OUTPUT APPARATUS

(75) Inventors: Yusuke Konagai, Hamamatsu (JP); Susumu Takumai, Hamamatsu (JP)

(73) Assignee: Yamaha Corporation (JP)

( * ) Notice: Subject to any disclaimer, the term of this patent is extended or adjusted under 35 U.S.C. 154(b) by 0 days.

(21) Appl. No.: 10/584,672

(22) PCT Filed: Dec. 24, 2004

(86) PCT No.: PCT/JP2004/019736

§ 371 (c)(1),
(2), (4) Date: Jun. 26, 2006

(87) PCT Pub. No.: WO2005/064986

PCT Pub. Date: Jul. 14, 2005

(65) Prior Publication Data

US 2007/0076905 A1 Apr. 5, 2007

(30) Foreign Application Priority Data

Dec. 25, 2003 (JP) ................................ 2003-429819

(51) Int. Cl.
*H03G 3/00* (2006.01)

(52) U.S. Cl. ........... 381/104; 381/102; 381/106; 381/98

(58) Field of Classification Search .................... 381/17, 381/98, 102, 104, 106–107, 61, 63, 333, 381/335, 388, 306–307, 300, 303, 77, 80, 381/97, 89

See application file for complete search history.

(56) References Cited

U.S. PATENT DOCUMENTS

| | | | | |
|---|---|---|---|---|
| 3,772,479 A | * | 11/1973 | Hilbert | 381/18 |
| 4,024,344 A | * | 5/1977 | Dolby et al. | 381/27 |
| 4,118,601 A | * | 10/1978 | Yeap | 381/103 |
| 4,472,834 A | | 9/1984 | Yamamura et al. | |
| 4,503,553 A | | 3/1985 | Davis | |
| 4,984,273 A | * | 1/1991 | Aylward et al. | 381/1 |
| 5,109,419 A | * | 4/1992 | Griesinger | 381/63 |
| 5,233,664 A | | 8/1993 | Yanagawa et al. | |
| 5,631,714 A | | 5/1997 | Saadoun | |

(Continued)

FOREIGN PATENT DOCUMENTS

GB 2 273 848 A 6/1994

(Continued)

OTHER PUBLICATIONS

Notification of Reason for Refusal issued Apr. 8, 2008 in corresponding Japanese Patent Application No. 2003-429819; English Translation Provided.

(Continued)

*Primary Examiner* — Devona E Faulk
*Assistant Examiner* — Disler Paul
(74) *Attorney, Agent, or Firm* — Rossi, Kimms & McDowell LLP

(57) ABSTRACT

An audio output apparatus has a measuring circuit which measures the levels of at least two sound signals, a sound level adjusting module (a sound level adjusting circuit and a gain control circuit) which adjusts a sound level so as to equal the levels of the sound signals based on the levels measured at the measuring circuit, and an array speaker unit (a delay circuit, a multiplier, an adder, an amplifier and a speaker unit) which emits sounds in accordance with the sound signals outputted from the sound level adjusting module in different directivities respectively.

19 Claims, 12 Drawing Sheets

U.S. PATENT DOCUMENTS

| | | | | |
|---|---|---|---|---|
| 5,666,424 | A * | 9/1997 | Fosgate et al. | 381/18 |
| 5,675,655 | A | 10/1997 | Hatae | |
| 5,930,373 | A * | 7/1999 | Shashoua et al. | 381/98 |
| 5,953,432 | A * | 9/1999 | Yanagawa et al. | 381/335 |
| 6,128,395 | A | 10/2000 | De Vries | |
| 6,181,796 | B1 | 1/2001 | Johnson | |
| 6,240,189 | B1 * | 5/2001 | Aylward | 381/18 |
| 6,498,852 | B2 * | 12/2002 | Grimani | 381/18 |
| 7,054,448 | B2 * | 5/2006 | Yoshino et al. | 381/59 |
| 7,319,641 | B2 * | 1/2008 | Goudie et al. | 367/138 |
| 2001/0016047 | A1 * | 8/2001 | Ohta | 381/98 |
| 2002/0191807 | A1 | 12/2002 | Asada et al. | |
| 2003/0185404 | A1 | 10/2003 | Milsap | |
| 2004/0071299 | A1 * | 4/2004 | Yoshino | 381/98 |
| 2005/0271230 | A1 * | 12/2005 | Sasaki | 381/333 |
| 2006/0050897 | A1 * | 3/2006 | Asada et al. | 381/98 |
| 2007/0165878 | A1 | 7/2007 | Konagai | |

FOREIGN PATENT DOCUMENTS

| | | | |
|---|---|---|---|
| JP | 5-41897 | A | 2/1993 |
| JP | 5-276591 | A | 10/1993 |
| JP | 6-62488 | A | 3/1994 |
| JP | 6-209500 | A | 7/1994 |
| JP | 6-225379 | A | 8/1994 |
| JP | 6-261385 | A | 9/1994 |
| JP | 6-269096 | A | 9/1994 |
| JP | 9-121400 | A | 5/1997 |
| JP | 9-233591 | A | 9/1997 |
| JP | 11-027604 | A | 1/1999 |
| JP | 11-69474 | A | 3/1999 |
| JP | 11-136788 | A | 5/1999 |
| JP | 2000-184448 | A | 6/2000 |
| JP | 2001-25084 | A | 1/2001 |
| JP | 2001-346297 | A | 12/2001 |
| JP | 2002-345077 | A | 11/2002 |
| JP | 2003-23689 | A | 1/2003 |
| JP | 2003-510924 | A | 3/2003 |
| JP | 2003-230071 | A | 8/2003 |
| JP | 2004-172661 | A | 6/2004 |
| JP | 2004-172703 | A | 6/2004 |
| JP | 2004-193698 | A | 7/2004 |
| JP | 2004-350173 | A | 9/2004 |
| JP | 2004-531125 | A | 10/2004 |
| JP | 2004-336530 | A | 11/2004 |
| JP | 2004-363697 | A | 12/2004 |
| JP | 2005-12765 | A | 1/2005 |
| JP | 2005-27020 | A | 1/2005 |
| JP | 2005-80079 | A | 3/2005 |
| WO | WO 01/23104 | A2 | 4/2001 |
| WO | WO 02/078388 | A2 | 10/2002 |

OTHER PUBLICATIONS

Search Report issued in application No. PCT/jp2005/000158, corresponding to related co-pending U.S. Appl. No. 10/585,269.

Notification of Refusal issued in Japanese application No. 2004-000675, corresponding to related co-pending U.S. Appl. No. 10/585,269.

Meyer, "Digital Control of Loudspeaker Array Directivity", XP-000763026; Oct. 1984; vol. 32 No. 110;pp. 747-754; New York. Corresponding to related co-pending U.S. Appl. No. 10/585,269.

Relevant portion of International Search Report of corresponding PCT Application PCT/JP2004/019736.

Supplementary European Search Report issued in corresponding European Patent Application No. 04808065.5 dated Sep. 25, 2009.

Decision of Refusal issued in application No. JP2004-000675, dated May 20, 2008, which corresponds with related co-pending U.S. Appl. No. 10/585,269.

Notification of Reasons for Refusal issued in Japanese application No. 2004-000675, corresponding to related co-pending U.S. Appl. No. 10/585,269; dated Feb. 19, 2008.

* cited by examiner

AUDIO OUTPUT APPARATUS

This application is a U.S. National Phase Application of PCT International Application PCT/JP2004/019736 filed on Dec. 24, 2004.

TECHNICAL FIELD

The present invention relates to an audio output apparatus which emits a plurality of sounds at the same time in different directivities respectively.

BACKGROUND OF THE INVENTION

As typified by a drop in the price of the plasma television, the screen of television receivers for ordinary households is becoming greater. For the diversity of television receivers using a large screen such as a wide screen in particular, there are many plasma television receivers which have a function that the screen is split into two parts to watch different programs (contents) at the same time. At this time, it is easy to watch the desired contents of pictures shown on the screen in multiple windows. However, when sounds are normally outputted at the same time, it is almost impossible to select only the sounds desired to hear. On this account, in the television receiver having the function to split the screen into two parts, sounds of first contents are outputted from speakers, and sounds of second contents are outputted from earphones. However, in the case of the television receiver like this, a viewer who watches the second contents has to use earphones all the time, causing a problem that usability is not good.

Then, an audio output apparatus is proposed in which directivity is controlled to output sounds in such a way that a plurality of sounds is provided with different directivities respectively (for example, see Patent Reference 1). In this audio output apparatus, it is proposed to use an array speaker for control over sound directivity. The array speaker has an advantage that has excellent control over directivity and can output a plurality of sounds in different directivities at the same time. In recent years, base technologies for the array speaker such as a digital amplifier and a small-sized full range speaker are progressing, and a digital processing circuit for delay and signal processing is reducing in price. Therefore, it is effective to use the array speaker for control over sound directivity.

Here, the principle of an array speaker in a known delay array system which is effective for directivity control and known for a long time will be described with reference to FIG. 13. It is considered that a large number of small-sized speakers 201-1 to 201-n are arranged linearly, and assuming that a straight line connecting a focal point P to each of the speakers 201-1 to 201-n is extended, an arc Z is defined so that the distance from the focal point P is L, virtual speakers 202-1 to 202-n indicated by broken lines shown in FIG. 13 are arranged on the intersection points of the extended straight lines with the arc Z. Since the distance from the virtual speakers 202-1 to 202-n to the focal point P is all L, sounds emitted from each of the speakers 202-1 to 202-n reach the focal point P at the same time.

In order to reach the sounds emitted from an actual speaker 201-i (i=1, 2 n) to the focal point P at the same time, a delay (time difference) corresponding to the distance between the speaker 201-i and the corresponding virtual speaker 202-i may be added to the sounds outputted from the speaker 201-i. More specifically, when seen from the focal point P, the virtual speakers 202-1 to 202-n are controlled as though they are arranged on the arc Z. Accordingly, at the focal point P, the output phases of the individual speakers 201-1 to 201-n are aligned, and a peak of sound pressure is formed. Consequently, directivity distribution can be obtained as though a sound wave beam is emitted toward the focal point P.

Patent Reference 1: JP-A-H11-027604

As described above, in the array speaker in the delay array system, it has an advantage that only the delay time is changed to move the orientation of sounds freely and a plurality of sounds can be outputted in different directivities at the same time. However, in the case of the audio output apparatus of Patent Reference 1 using the array speaker like this, it has some points to be problems for practical use.

FIG. 14 shows an exemplary polar pattern in simulation. This simulation is the case in which the focal point is formed at the front by a practical array speaker which is linearly arranged to have the total array width of about one meter. The front is the upper side in FIG. 14. According to the exemplary simulation shown in FIG. 14, it is revealed that with respect to a high audibility sound of 2 kHz, a sound pressure difference of 20 dB can be realized at the position two meters distant from the array speaker in the direction at an angle of 30 degrees distant from the central direction of directivity. This sound pressure difference allows a viewer in the central direction of directivity to hear the sounds of contents at the moderate sound level and another viewer at the different position to hear the sounds of the same contents at a low sound level. When a plurality of sounds is outputted in different directivities as the audio output apparatus of Patent Reference 1, for individual viewers, they hear mixed sounds of the sounds of contents that the viewers desire to hear at the moderate sound level with the sounds of the other contents at the low sound level (disturbance sound).

The importance in the audio output apparatus of Patent Reference 1 is that the sounds of the other contents become the sound level smaller enough than the sounds of contents that are desired to hear. When there is a sound pressure difference like this, the masking effect that is the characteristic of audibility and the cocktail party effect that is the characteristic of psycho acoustics serve in a manner to aid hearing target sounds. Therefore, the viewer can hear the target sounds of contents among a plurality of sounds.

However, when the absolute sound levels of a plurality of sound signals inputted to the array speaker are greatly varied, the sound pressure difference realized by directivity control over the array speaker is likely to be cancelled. When the sound pressure difference between the target contents and the other contents becomes insufficient, the sounds of the other contents become annoying, and at the worst, the target sounds of contents cannot be heard. For the reason why the sound pressure difference between the target contents and the other contents become insufficient, two reasons can be mainly considered.

The first reason is that the recording levels of sounds are varied at each of the contents. Since it is natural that the recording levels of sounds are varied at each of the contents, a volume control of the audio output apparatus sets the sound level of each of the contents to the optimum value (the value that the separation of audibility becomes optimum at the positions of the individual viewers). However, even though the volume control is set to the optimum value during the playback of certain contents, this setting for the volume control might not be suitable in the playback of the other contents. When the volume control is set unsuitably in this manner, the sound pressure difference of the contents different from the target contents becomes insufficient, and the separation of audibility is deteriorated. In order to improve hearing the target sounds of contents, the volume control needs to be adjusted for each of the contents.

The second reason is that the sound level of contents is changed at any time. For example, when a sound such as an explosion sound is played at a high sound level in different contents while a silent section is continued in target contents, this change in the sound level reverses the sound pressures of the target contents and the other contents.

In addition, for another problem that affects the separation of audibility, there is a problem that it is difficult to perform directivity control over a wide sound frequency band. When a delay array is taken as an example, the main lobe width of directivity is determined by the ratio of a signal wavelength to the width of an array speaker. High audio frequencies have strong directivity, whereas low audio frequencies have weak directivity. With reference to FIG. 14, it is revealed that directivity is changed by frequencies. The directivity becomes weak in the low audio frequencies, and it is difficult to secure the separation. On the other hand, in high audio frequencies that are wavelengths shorter than the pitch between speaker units of the delay array, a grating lobe is generated in a directivity pattern, and a side lobe is generated in the directivity pattern even in the wavelengths longer than those frequencies. Therefore, the grating lobe and the side lobe might deteriorate the separation of audibility.

DISCLOSURE OF THE INVENTION

The invention has been made to solve the problems. An object is to provide an audio output apparatus which can separate sounds that individual viewers desire to hear from other sounds to listen to the sounds excellently in a system which respectively emits a plurality of sounds in different directivities at the same time, that is, an audio output apparatus which can improve the separation of audibility of a plurality of sounds.

The invention has the following configuration for a means of solving the problems.

(1) An audio output apparatus characterized by comprising:
- measuring means for measuring levels of a plurality of inputted sound signals;
- sound level adjusting means for adjusting gains based on the levels measured by the measuring means and outputting the plurality of sound signals in equal magnitudes; and
- an array speaker unit which emits a plurality of sounds in accordance with the plurality of sound signals outputted from the sound level adjusting means in different directivities, respectively.

(2) The audio output apparatus according to (1), characterized in that:
- the measuring means separates the plurality of the sound signals into a plurality of frequency bands to measure levels, and
- the sound level adjusting means assigns weights on the measured levels of the frequency bands with a predetermined weight for each of the frequency bands, adjusts the gains based on the weighted levels of the individual frequency bands, and outputs the plurality of the sound signals in equal magnitudes.

(3) The audio output apparatus according to (1), characterized in that:
- the measuring means separates the plurality of the sound signals into a plurality of frequency bands to measure levels, and
- the sound level adjusting means adjusts and outputs gains so that the plurality of the sound signals is made to have equal magnitudes for each of the frequency bands based on the measured levels of the respective frequency bands.

(4) An audio output apparatus characterized by comprising:
- measuring means for measuring levels of a plurality of inputted sound signals;
- sound level adjusting means for adjusting gains based on the levels measured by the measuring means and outputs a plurality of sound signals so that a level difference between at least two sound signals specified by a viewer is made constant among the plurality of the sound signals; and
- an array speaker unit which emits a plurality of sounds in accordance with the plurality of the sound signals outputted from the sound level adjusting means in different directivities respectively.

(5) An audio output apparatus characterized by comprising:
- a measuring means for measuring levels of a plurality of inputted sound signals;
- a compression means for compressing a plurality of dynamic ranges of the sound signals to a predetermined value or below based on the levels measured by the measuring means and outputs a plurality of sound signals after the dynamic ranges are compressed; and
- an array speaker unit which emits a plurality of sounds in accordance with the plurality of the sound signals outputted from the compression means in different directivities respectively.

(6) An audio output apparatus characterized by comprising:
- frequency control means for limiting or emphasizing frequency bands of a plurality of inputted sound signals; and
- an array speaker unit which emits a plurality of sounds in accordance with the plurality of the sound signals outputted from the frequency control means in different directivities respectively.

(7) An audio output apparatus characterized by comprising:
- a measuring circuit which measures levels of a plurality of inputted sound signals;
- a gain control circuit which refers the levels measured by the measuring circuit and sets a gain coefficient to each of the sound signals;
- a sound level adjusting circuit which adjusts the levels of the sound signals based on the set gain coefficient; and
- an array speaker unit to which a plurality of sound signals adjusted at the level is inputted and which emits a plurality of sounds in accordance with the plurality of the sound signals in different directivities respectively.

(8) The audio output apparatus according to (7), characterized in that the gain control unit sets the gain coefficient so that the plurality of the levels of the sound signals inputted is nearly equal to each other.

(9) The audio output apparatus according to (7), characterized in that the gain control unit includes an offset generating circuit which adds a certain amount of an offset amount to at least one level among the levels measured by the measuring circuit.

(10) The audio output apparatus according to (7), characterized in that the gain control unit sets the gain coefficient so that dynamic ranges of the plurality of sound signals inputted to the array speaker unit is made to have a predetermined value or below.

(11) The audio output apparatus according to (7), characterized by further comprising a band pass filter to which a plurality of sound signals is inputted and which limits a frequency band of the sound signal.

(12) The audio output apparatus according to (11), characterized in that the sound signal limited in the frequency band by the band pass filter is outputted to the measuring circuit.

(13) The audio output apparatus according to (11), characterized in that the sound signal limited in the frequency band by the band pass filter is outputted to the sound level adjusting circuit.

According to the invention, by providing the measuring module which measures a plurality of levels of sound signals inputted and the sound level adjusting module which adjusts gains based on the levels measured at the measuring module and outputs a plurality of the sound signals in equal magnitudes, the sound level is adjusted so as to equal a plurality of the levels of the sound signals outputted from the sound level adjusting module to the array speaker unit. Therefore, such work is eliminated that a volume control is adjusted at each item of the contents. In addition, a problem can be relaxed that when target sounds reach a low sound level, they are lost in other sounds and the target sounds cannot be heard. Therefore, according to the invention, the separation of audibility of a plurality of sounds can be improved, whereby the individual viewers can excellently listen to the sounds desired to hear, and an audio output apparatus can be provided for practical use which emits a plurality of sounds in different directivities respectively at the same time.

In addition, by providing the measuring module which measures a plurality of levels of sound signals inputted and the sound level adjusting module which adjusts gains based on the levels measured at the measuring module and outputs a plurality of sound signals so that a level difference between at least two sound signals specified by a viewer is made constant among the plurality of the sound signals, outputted from the sound level adjusting module to the array speaker unit, the subjective and psychological separation can be improved between the contents having a great psychological difference in audibility for the audibility characteristic other than a volume control such as difference in the frequency bands of the contents and the difference in the ratio of euphonic changes (double or long consonants and syllabic n) because of the differences in languages.

In addition, by providing the measuring module which measures a plurality of levels of sound signals inputted and the compression module which compresses a plurality of dynamic ranges of the sound signals to a predetermined value or below based on the levels measured at the measuring module and outputs a plurality of sound signals after the dynamic ranges are compressed, a plurality of the dynamic ranges of the sound signals is compressed to a predetermined value or below, the sound signals are outputted from the sound level adjusting module to the array speaker unit. Therefore, the dynamic ranges of each item of contents can be aligned. In addition, the dynamic range is compressed to relax problems that target sounds are lost in other sounds because they are at a low sound level and that target sounds interfere with other sounds. Therefore, according to the invention, the separation of audibility of a plurality of sounds can be improved. Since the compression of the dynamic range is an effective technique when environmental noise is great such as a car stereo, it is useful in a system which outputs a plurality of sounds at the same time.

In addition, by providing the frequency control module which limits a plurality of frequency bands of sound signal inputted, a plurality of the sound signals is outputted to the array speaker unit after removal of low audio frequencies that are difficult for directivity control. Thus, the directivity of each of a plurality of sounds emitted from the array speaker unit in accordance with a plurality of the sound signals can be enhanced. After removal of the high audio frequencies that cause generation of a grating lobe and a side lobe of a directivity pattern, a plurality of the sound signals is outputted to the array speaker unit, whereby a grating lobe and a side lobe can be prevented from being generated in a directivity pattern of each of a plurality of sounds emitted from the array speaker unit in accordance with a plurality of the sound signals. Alternatively, by providing the frequency control module which emphasizes a plurality of frequency bands of sound signal inputted, a specific frequency band of excellent directivity control can be emphasized relatively with respect to low audio frequencies and high audio frequencies. Therefore, the separation of audibility and the psychological separation of a plurality of sounds can be improved.

In addition, a plurality of sound signals is separated into a plurality of frequency bands to measure a level, and the measured levels of the individual frequency bands are assigned with weights with a weight for each of the frequency bands to adjust gains of a plurality of the sound signals based on the weighted levels of the individual frequency bands. Therefore, the levels of psychological audibility are matched with each other to expect an improved separation.

In addition, gains are adjusted so as to equal a plurality of sound signals at each frequency band. Therefore, the masking effect of a plurality of the sound signals to each other can be worked more effectively, and an improved separation can be expected.

BEST MODE FOR CARRYING OUT THE INVENTION

First Embodiment

Figure 1:
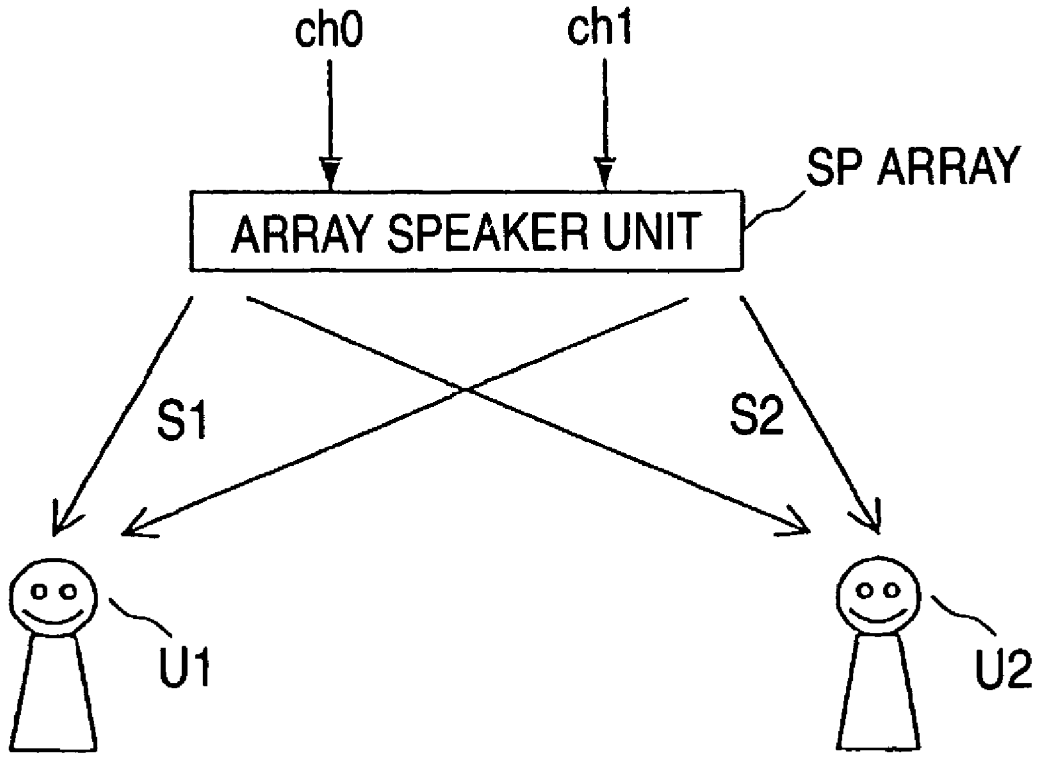
FIG. 1 is a diagram illustrative of the principle of an audio output apparatus according to a first embodiment of the invention.

Hereinafter, embodiments of the invention will be described in detail with reference to the drawings. FIG. 1 is a diagram illustrative of the principle of a first embodiment.

As similar to the audio output apparatus before, in an audio output apparatus according to the embodiment, directivity is controlled to emit sounds S1 and S2 from an array speaker unit SParray so that the first sound S1 and the second sound S2 separately have different directivities. However, at this time, the sound levels are adjusted so as to equal the levels of a first sound signal ch0 and a second sound signal ch1 which are the base of the sounds S1 and S2, and the sound signals ch0 and ch1 are inputted to the array speaker unit SParray.

Figure 2:
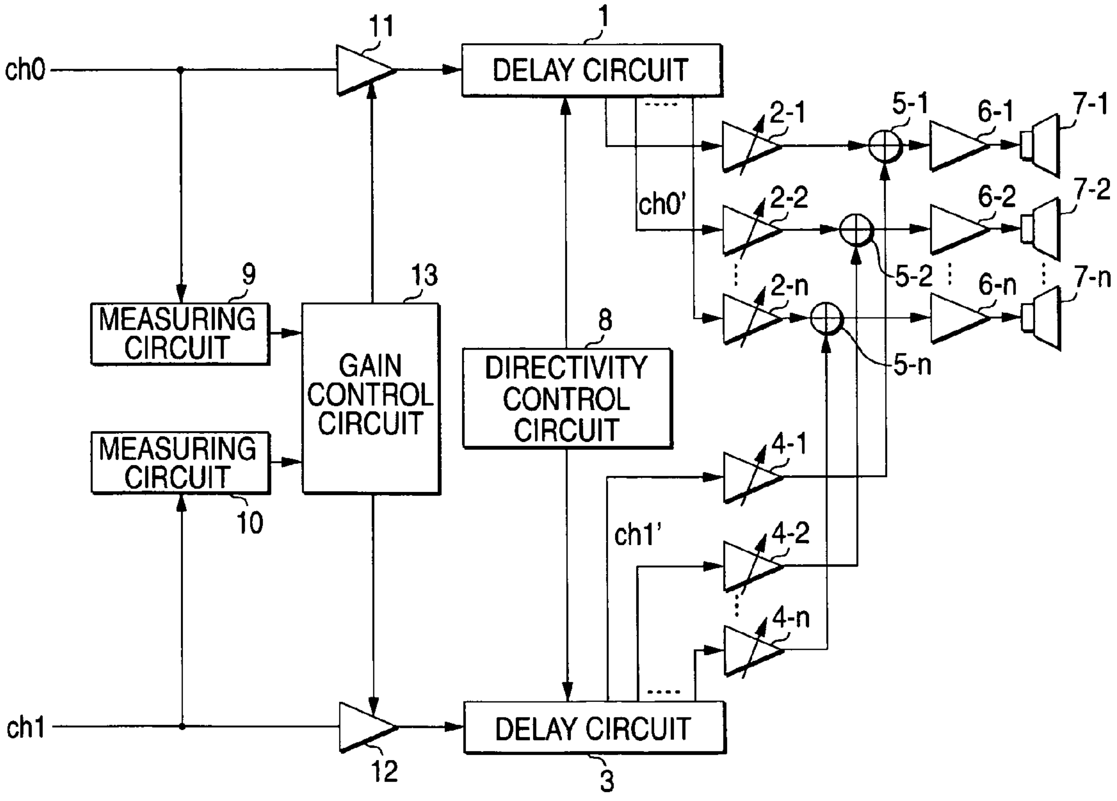
FIG. 2 shows a block diagram showing the configuration of the audio output apparatus according to the first embodiment of the invention.

FIG. 2 is a block diagram showing the configuration of the audio output apparatus according to the first embodiment of the invention. The audio output apparatus shown in FIG. 2 has a measuring circuit 9 which measures the level of the first sound signal ch0, a measuring circuit 10 which measures the level of the second sound signal ch1, a sound level adjusting circuit 11 which adjusts the level of the first sound signal ch0, a sound level adjusting circuit 12 which adjusts the level of the second sound signal ch1, a gain control circuit 13 which sets the gain coefficients of the sound level adjusting circuits 11 and 12, a delay circuit 1 which adds the delay time corresponding to a desired directivity to an output signal of the sound level adjusting circuit 11, a multiplier 2 (2-1 to 2-n) which multiplies the output of the delay circuit 1 by the gain coefficient to adjust it to a desired level, a delay circuit 3 which adds the delay time corresponding to a desired directivity to the output signal of the sound level adjusting circuit 12, a multiplier 4 (4-1 to 4-n) which multiplies the output of the delay circuit 3 by the gain coefficient to adjust it to a desired level, an adder 5 (5-1 to 5-n) which adds an output signal of the multiplier 2 to an output signal of the multiplier 4, an amplifier 6 (6-1 to 6-n) which amplifies an output signal of the adder 5, a speaker unit 7 (7-1 to 7-n) which is driven by the amplifier 6, and a directivity control unit 8 which sets the delay times of the delay circuits 1 and 3.

The audio output apparatus according to the embodiment is formed in which the array speaker unit which is formed of the delay circuits 1 and 3, the multipliers 2 and 4, the adder 5, the amplifier 6 and the speaker unit 7 is added with the measuring circuits 9 and 10, the sound level adjusting circuits 11 and 12, and the gain control circuit 13. A sound level adjusting module is configured of the sound level adjusting circuits 11 and 12 and the gain control circuit 13.

Next, the operation of the audio output apparatus according to the embodiment will be described. The first sound signal ch0 is inputted to the measuring circuit 9 and the sound level adjusting circuit 11, and the second sound signal ch1 is inputted to the measuring circuit 10 and the sound level adjusting circuit 12.

The measuring circuit 9 at any time measures the level of the first sound signal ch0, and the measuring circuit 10 at any time measures the level of the second sound signal ch1. The measuring circuits 9 and 10 use the absolute value of the signal to measure the levels of the sound signals ch0 and ch1 by peak holding having a time constant, envelope detection and the like.

The gain control circuit 13 sets the gain coefficients of the sound level adjusting circuits 11 and 12 so that the levels of the sound signals ch0 and ch1 outputted to the array speaker unit (the delay circuits 1 and 3) are equal to each other based on the difference between the level of the sound signal ch0 measured at the measuring circuit 9 and the level of the sound signal ch1 measured at the measuring circuit 10.

Figure 3:
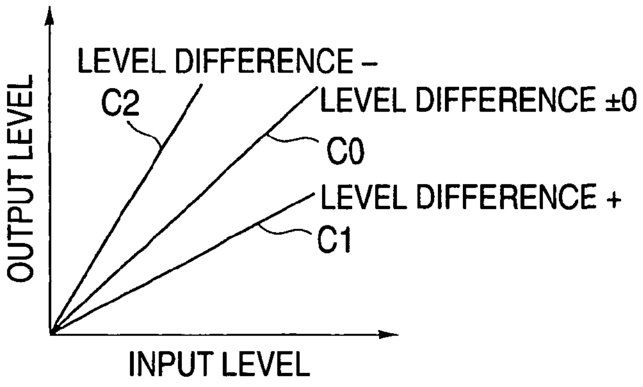
FIG. 3 is a diagram showing the input/output characteristics of a sound level adjusting circuit which is controlled by a gain control circuit in the first embodiment of the invention.

The gain control circuit 13 outputs the gain coefficient in accordance with the difference between the level of the first sound signal ch0 measured at the measuring circuit 9 and the level of the second sound signal ch1 measured at the measuring circuit 10. The input/output characteristics of the sound level adjusting circuits 11 and 12 are the characteristic that subtracts the difference between the levels of the sound signals ch0 and ch1 to be outputted to the delay circuits 1 and 3. The input/output characteristics of the sound level adjusting circuits 11 and 12 controlled by the gain control circuit 13 are shown in FIG. 3. In FIG. 3, C0 is an input/output characteristic when the difference between the levels of the sound signals ch0 and ch1 is zero, C1 is an input/output characteristic when the level difference is positive, and C2 is an input/output characteristic when the level difference is negative.

When the level of the first sound signal ch0 is greater than that of the second sound signal ch1, the gain control circuit 13 reduces the gain coefficient to be set to the sound level adjusting circuit 11 as well as increases the gain coefficient to be set to the sound level adjusting circuit 12. Suppose the states are changed from the state of the equal levels of the sound signals ch0 and ch1 to the state of the great level of the sound signal ch0, the level difference that the level of the sound signal ch1 is subtracted from the level of the sound signal ch0 is changed to the positive value. Therefore, the input/output characteristic of the sound level adjusting circuit 11 is changed from the characteristic C0 to C1 shown in FIG. 3, and the level difference that the level of the sound signal ch0 is subtracted from the level of the sound signal ch1 is changed to the negative value. Thus, the characteristic of the sound level adjusting circuit 12 is changed from the characteristic C0 to C2. When the level of the first sound signal ch0 is smaller than that of the second sound signal ch1, the gain control circuit 13 increases the gain coefficient to be set to the sound level adjusting circuit 11 as well as reduces the gain coefficient to be set to the sound level adjusting circuit 12.

When the difference between the levels of the sound signals ch0 and ch1 to be inputted to the measuring circuits 9 and 10 is changed, the gain coefficient to be set to the sound level adjusting circuits 11 and 12 is changed as well. However, when the gain coefficient is instantaneously changed in response to the change in the level difference, an unnatural feeling is given in audibility. Then, the gain control circuit 13 causes the gain coefficient to be changed at a certain time constant with respect to the change in the level difference.

The sound level adjusting circuit 11 multiplies the inputted first sound signal ch0 by the gain coefficient set by the gain control circuit 13, and thus adjusts and outputs the level of the first sound signal ch0. Similarly, the sound level adjusting circuit 12 multiplies the inputted second sound signal ch1 by the gain coefficient set by the gain control circuit 13, and thus adjusts and outputs the level of the second sound signal ch1.

The first sound signal ch0 having passed through the sound level adjusting circuit 11 is inputted to the delay circuit 1, and becomes first sound signals ch0' by the number of the speaker units, each of which is added with the delay time by the delay circuit 1. The delay time that is added to the first sound signal at the delay circuit 1 is adjusted so that the first sound S1 corresponding to the first sound signal is directed toward the focal point which is freely set, the first sound signal is supplied to the speaker unit 7-i (i=1, 2, to n). More specifically, as similar to the array speaker unit before, the delay time at the delay circuit 1 is calculated for each of the speaker units by the directivity control unit 8 based on the position of the focal point and the position of each of the speaker units 7-1 to 7-n, and is set to the delay circuit 1. The first sound signal ch0' added with the delay time by the delay circuit 1 is adjusted to a desired level by the multipliers 2-1 to 2-n. Each of the first sound signals ch0' may be multiplied by a coefficient of a predetermined window function by the multipliers 2-1 to 2-n.

Similarly, the second sound signal ch1 having passed through the sound level adjusting circuit 12 becomes second sound signals ch1' by the number of the speaker units, each of which is added with the delay time by the delay circuit 3. The delay time that is added to the second sound signal by the delay circuit 3 is adjusted so that the second sound S2 corresponding to the second sound signal is directed toward the focal point which is different from that of the first sound S1. The second sound signal ch1' added with the delay time by the delay circuit 3 is adjusted to a desired level by the multipliers 4-1 to 4-n.

Subsequently, the outputs of the multipliers 2-1 to 2-n are added to the outputs of the multipliers 4-1 to 4-n by the adders 5-1 to 5-n, the outputs of the adders 5-1 to 5-n are amplified by the amplifiers 6-1 to 6-n, and sounds are emitted from the speaker units 7-1 to 7-n. The signals outputted from each of the speaker units 7-1 to 7-n interfere with each other in spaces to form the beam of the first sound S1 and the beam of the second sound S2. As shown in FIG. 1, the first sound S1 goes toward a first viewing position of U1, and the second sound S2 goes toward a second viewing position of U2.

Figure 4:
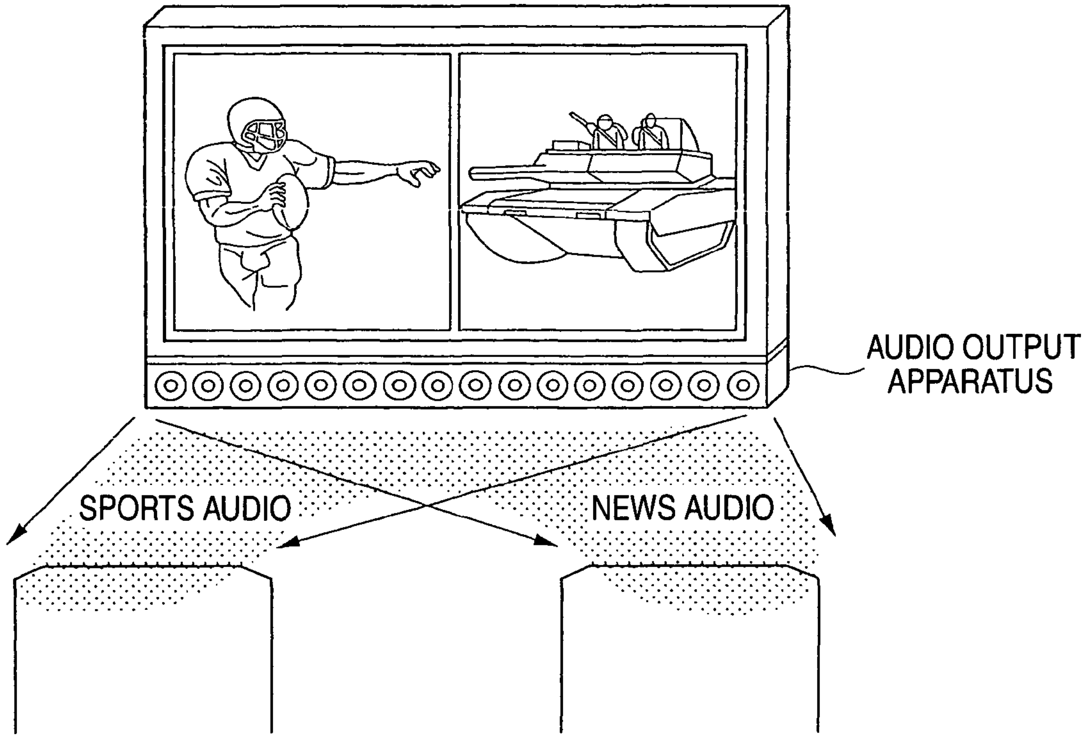
FIG. 4 is a diagram showing an exemplary use form of the audio output apparatus.

FIG. 4 shows an exemplary use form of the audio output apparatus. The example shown in FIG. 4 shows the audio output apparatus for use in a system which outputs pictures and sounds of a plurality of contents (for example, a sports program and a news program) at the same time. The pictures of a plurality of the contents are displayed on multiple windows at the same time. Each of the sounds of a plurality of the contents is emitted from the audio output apparatus in different directivities respectively. Thus, for example, a viewer on the left side of a room and a viewer on the right side of the room can listen to different sounds.

Figure 5:
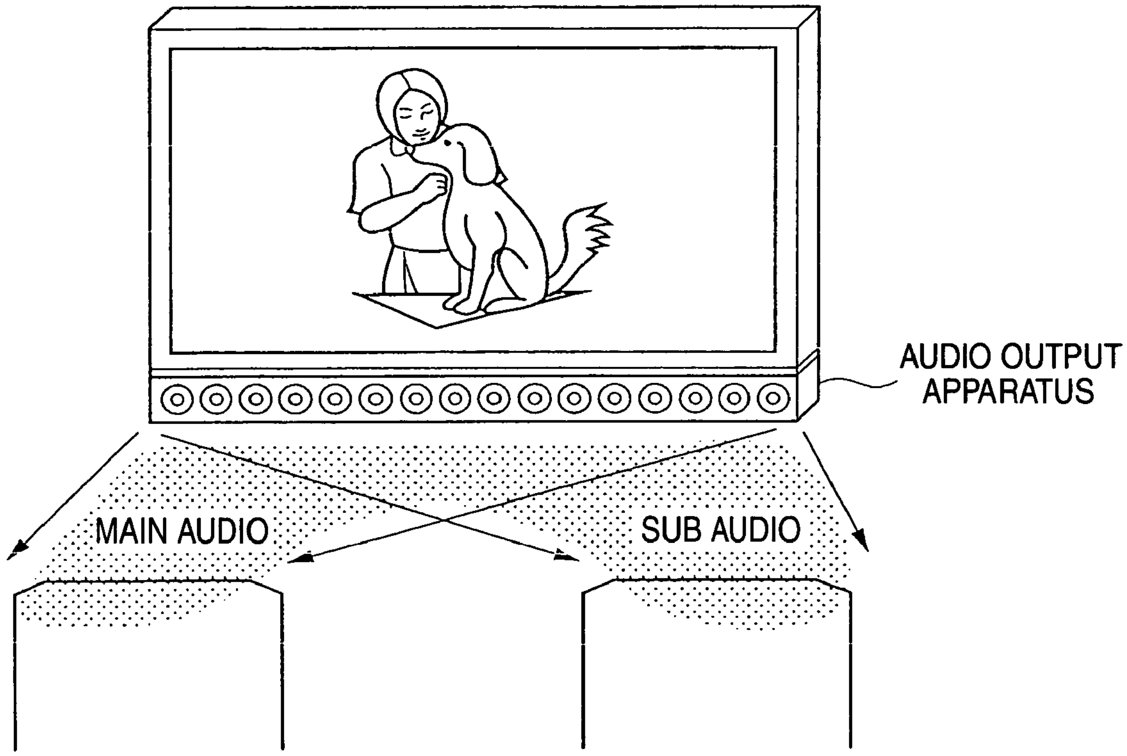
FIG. 5 is a diagram showing another exemplary use form of the audio output apparatus.

FIG. 5 shows another exemplary use form of the audio output apparatus. The example shown in FIG. 5 shows the audio output apparatus for use in a system which outputs a single picture and two sounds contained in a single item of contents at the same time. For the example of the contents like this, there is broadcasting in two languages in which the audio output apparatus emits sounds so that a main sound and a sub sound are provided with different directivities respectively. Thus, the viewer on the left side of the room can listen to the main sound, for example, and the viewer on the right side of the room can listen to the sub sound, for example.

According to the embodiment, the gain coefficients of the sound level adjusting circuits 11 and 12 are set so as to equal the levels of the sound signals ch0 and ch1 to be out putted to the array speaker unit. Therefore, such work can be eliminated that the volume control is adjusted for each of the contents. In addition, a problem can be relaxed that when the target sounds of contents reach the low sound level, the sounds are lost in the sounds of the other contents and the target sounds cannot be heard. Therefore, in the embodiment, the separation of audibility for the sound signals ch0 and ch1 can be improved, and the individual viewers can listen to the sounds desired to hear.

Second Embodiment

Figure 6:
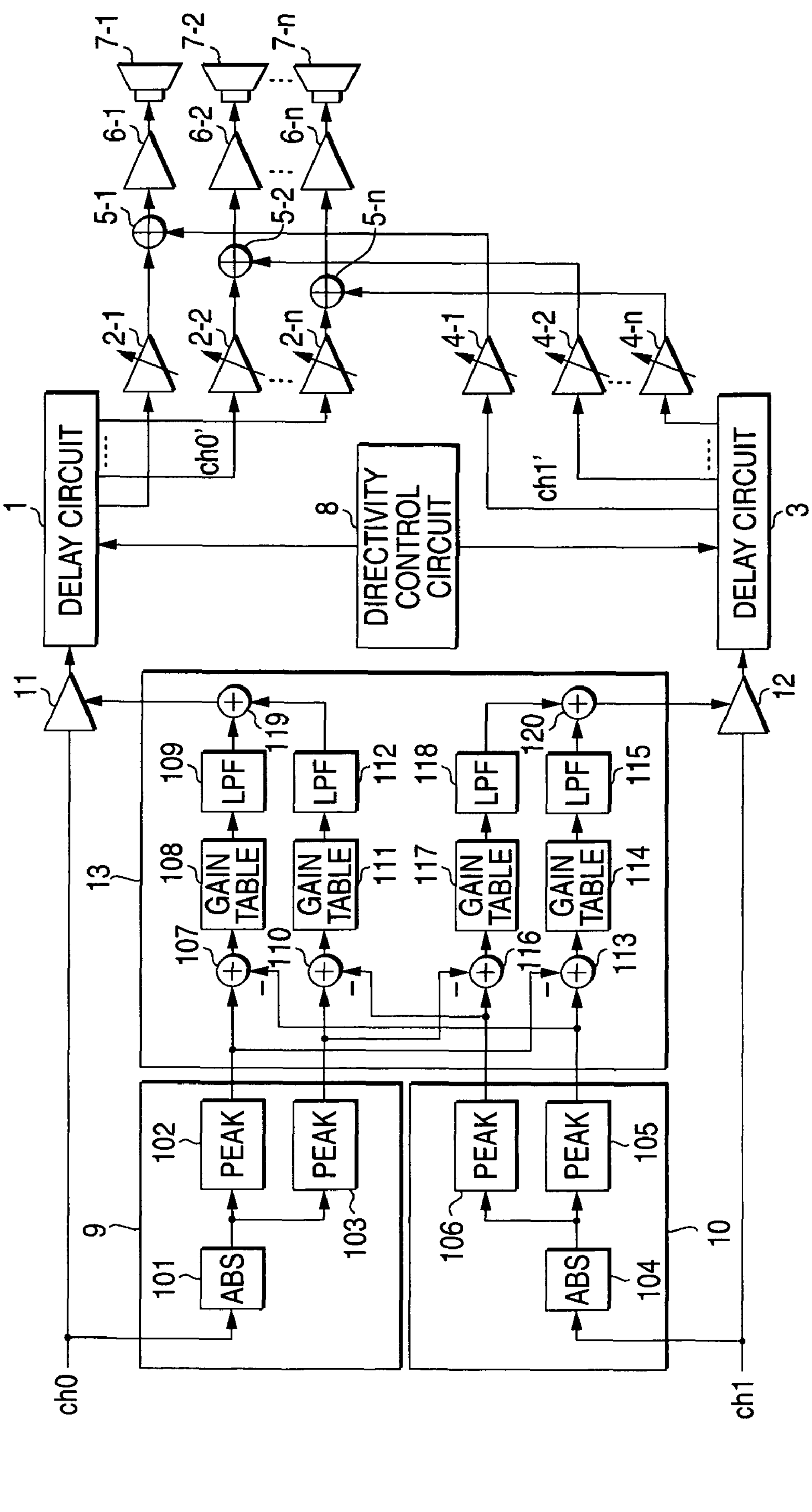
FIG. 6 is a block diagram showing the configuration of an audio output apparatus according to a second embodiment of the invention.

Next, a second embodiment of the invention will be described. FIG. 6 shows a block diagram showing the configuration of an audio output apparatus according to the second embodiment of the invention, and the same numerals and signs are designated to the same configuration as that shown in FIG. 2. The audio output apparatus according to the embodiment shows a more specific example of the first embodiment.

A measuring circuit 9 according to the embodiment is formed of a rectifier circuit 101 and peak hold circuits 102 and 103. The rectifier circuit 101 rectifies the inputted first sound signal ch0 to the absolute value. The peak hold circuits 102 and 103 hold and output the greatest value among input values up to now in such a way that the hold value is maintained when the value inputted from the rectifier circuit 101 is equal to or smaller than the current hold value whereas an input value is made to a new hold value when the input value exceeds the hold value. When such a state continues that the input value is smaller than the hold value, the hold value gradually drops at a given time constant. The time constant of the peak hold circuit 102 is set shorter than the time constant of the peak hold circuit 103.

Similarly, a measuring circuit 10 is formed of a rectifier circuit 104 and peak hold circuits 105 and 106. The time constants of the peak hold circuits 105 and 106 may be the same as the time constants of the peak hold circuits 102 and 103, respectively.

Next, a gain control circuit 13 is formed of subtracters 107, 110, 113 and 116, gain tables 108, 111, 114 and 117, low pass filters 109, 112, 115 and 118, and adder 119 and 120.

The subtracter 107 calculates the level difference that the output of the peak hold circuit 105 is subtracted from the output of the peak hold circuit 102. The subtracter 110 calculates the level difference that the output of the peak hold circuit 106 is subtracted from the output of the peak hold circuit 103. The subtracter 113 calculates the level difference that the output of the peak hold circuit 102 is subtracted from the output of the peak hold circuit 105. The subtracter 116 calculates the level difference that the output of the peak hold circuit 103 is subtracted from the output of the peak hold circuit 106.

In the gain tables 108, 111, 114 and 117, the gain coefficient is associated with the level difference between the sound signals and registered before hand. The gain tables 108, 111, 114 and 117 read and output the gain coefficients in accordance with the level differences calculated at the subtracters 107, 110, 113 and 116.

The gain coefficients outputted from the gain tables 108 and 111 pass through the low pass filters 109 and 112, respectively, they are added by the adder 119, and the gain coefficient after added is set to a sound level adjusting circuit 11. In addition, the gain coefficients outputted from the gain tables 114 and 117 pass through the low pass filters 115 and 118, they are added by the adder 120, and the gain coefficient after added is set to a sound level adjusting circuit 12.

The low pass filters 109, 112, 115 and 118 smoothly change the gain coefficient at a given time constant. In addition, the time constant of the low pass filter 109 is set shorter than the time constant of the low pass filter 112. The time constant of the low pass filter 115 maybe the same as the time constant of the low pass filter 109, and the time constant of the low pass filter 118 maybe the same as the time constant of the low pass filter 112.

The operation of the sound level adjusting circuits 11 and 12 after the gain coefficients are set, and the operation of the array speaker unit formed of delay circuits 1 and 3, multipliers 2 and 4, an adder 5, an amplifier 6, and a speaker unit 7 are the same as those of the first embodiment.

In the embodiment, the time constants of the peak hold circuits 102 and 105 are set shorter than the time constants of the peak hold circuits 103 and 106. The time constants of the low pass filters 109 and 115 are set shorter than the time constants of the low pass filters 112 and 118. Two each of the peak hold circuit, the gain table, and the low pass filter are set to the gain coefficient for the sound level adjusting circuits 11 and 12, and two types of the time constants are provided for adjusting the sound level. Thus, the sound level adjustment in accordance with a short term change in the level difference between the first sound signal ch0 and the second sound signal ch1 and the sound level adjustment in accordance with a long term change in the level difference can be done at a given ratio. Although a shorter time constant is better in order to follow a momentary change in the level difference, it is not good to offend the ears by such changes that the volume control is changed at random. Therefore, the configuration according to the embodiment allows a proper setting of the balance between the sound level adjustment in accordance with a short term change in the level difference and the sound level adjustment in accordance with a long term change in the level difference.

Third Embodiment

In the first and second embodiments, the gain coefficients of the sound level adjusting circuits 11 and 12 are set so as to equal the levels of the first sound signal ch0 and the second sound signal ch1 outputted to the array speaker unit (the delay circuits 1 and 3). However, the gain coefficients may be set so that the difference between the first sound signal ch0 and the level of the second sound signal ch1 is made constant.

Figure 7:
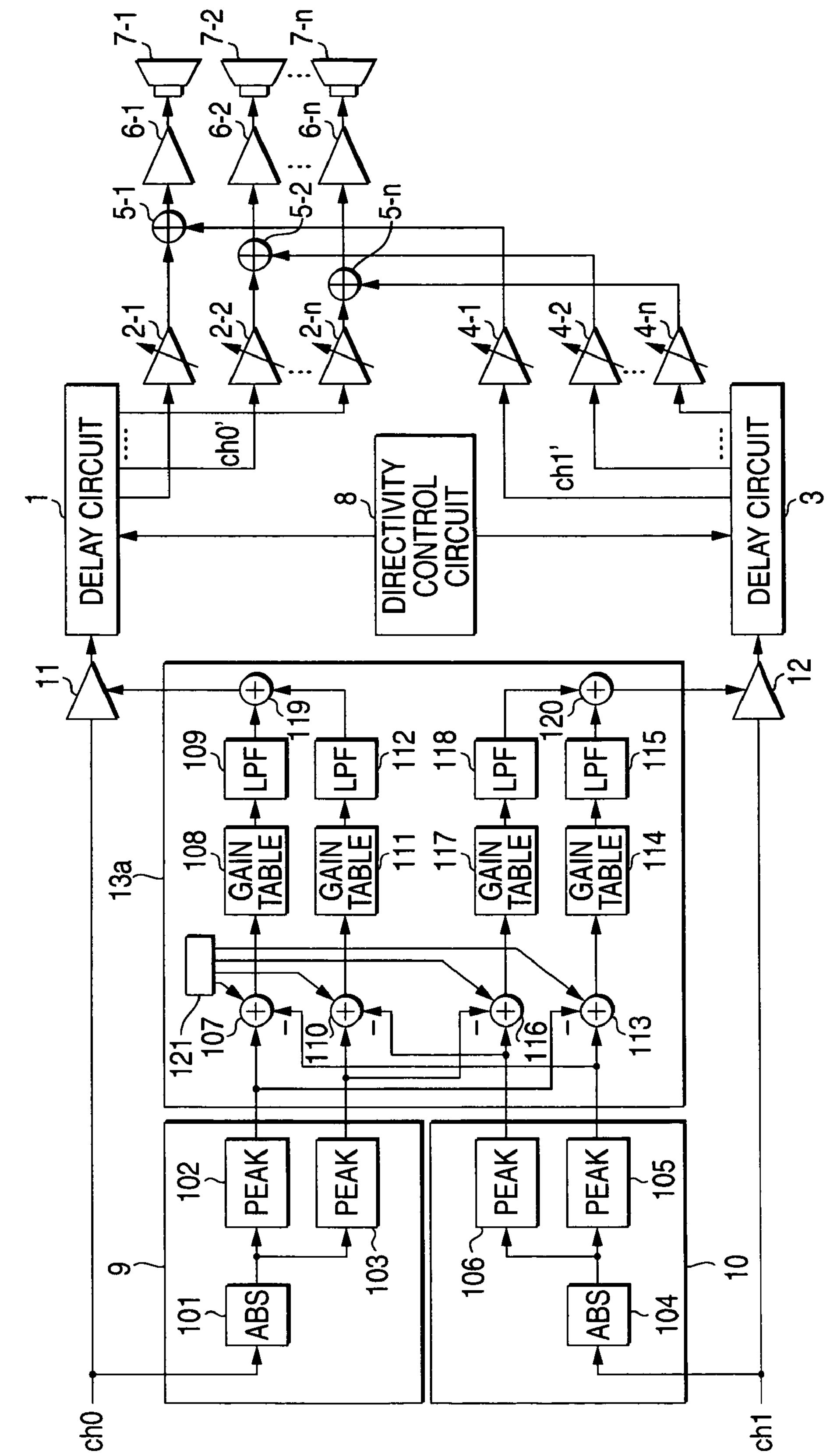
FIG. 7 is a block diagram showing the configuration of an audio output apparatus according to a third embodiment of the invention.

FIG. 7 is a block diagram showing the configuration of an audio output apparatus according to a third embodiment of the invention, and the same numerals and signs are designated to the same configuration as that shown in FIG. 6. In the audio output apparatus according to the embodiment, a gain control circuit 13*a* is used instead of the gain control circuit 13 shown in FIG. 6. The gain control circuit 13*a* is added with a function that adds a given amount of offset set by a viewer to the outputs of the subtracters 107, 110, 113 and 116 in the gain control circuit 13.

For example, when it is desired to increase a certain amount of the level of the first sound signal ch0 with respect to the second sound signal ch1, the offset amount is added to the outputs of subtracters 113 and 116 by an offset generating circuit 121, whereas the offset amount is not added to the outputs of subtracters 107 and 110.

Thus, since the level difference added with the offset amount is inputted to the gain tables 114 and 117, the gain coefficients outputted from the gain tables 114 and 117 become smaller than those in the second embodiment. Therefore, since the gain coefficient to be set in a sound level adjusting circuit 12 becomes small, the level of the second sound signal ch1 is smaller than the first sound signal ch0 by the amount corresponding to the offset amount.

As described above, according to the embodiment, the level difference between the first sound signal ch0 and the second sound signal ch1 can be made constant all the time. When a plurality of sounds is outputted at the same time, the provision of a certain differential some times improves subjective/psychological separations more than matching the sound levels of individual sounds. For example, it is unlikely to be interference even though English of the sub sound is heard louder more or less when a person who is not good at English listens to Japanese of the main sound in two languages. However, when he/she tries to listen to English, even a low sound level of Japanese becomes annoying. Then, when the sound level of Japanese of the main sound is made small, listening to English can be made easy.

As described above, when the varied sound levels of individual sounds make listening easier, a viewer sets a desired sound level difference (offset amount) to the audio output apparatus. The gain control circuit 13*a* adds the offset amount to the input of the gain table with respect to the gain table corresponding to the sound that is specified by the viewer for a smaller sound level. In this manner, the viewer can provide a desired difference to the sound levels of the individual sounds.

In addition, in the second and third embodiments, the sound levels of the sound signals ch0 and ch1 are adjusted based on the time constant corresponding to a short term change in the level difference between the first sound signal ch0 and the second sound signal ch1 and the time constant corresponding to a long term change in the level difference, but a single time constant may be sufficient.

Fourth Embodiment

Figure 8:
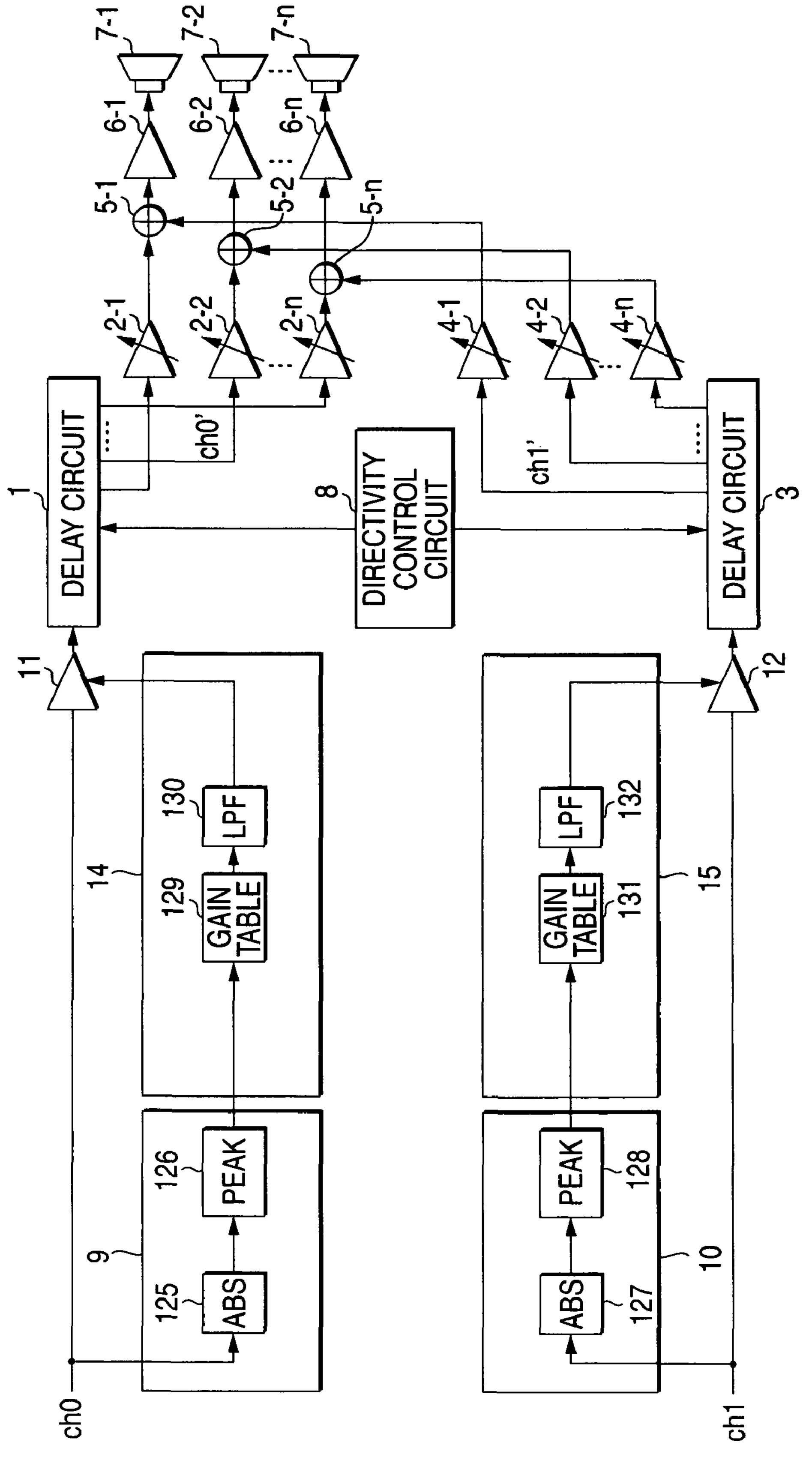
FIG. 8 is a block diagram showing the configuration of an audio output apparatus according to a fourth embodiment of the invention.

Next, a fourth embodiment of the invention will be described. FIG. 8 is a block diagram showing the configuration of an audio output apparatus according to the fourth embodiment of the invention, and the same numerals and signs are designated to the same configuration as that shown in FIG. 2. In the audio output apparatus according to the embodiment, an array speaker unit formed of delay circuits 1 and 3, multipliers 2 and 4, an adder 5, an amplifier 6 and a speaker unit 7 is added with measuring circuits 9 and 10, sound level adjusting circuits 11 and 12 and gain control circuits 14 and 15. A compression module is configured of the sound level adjusting circuits 11 and 12 and the gain control circuits 14 and 15.

The operations of the measuring circuits 9 and 10 are the same as those in the first embodiment. The time constant (release time) that determines the hold periods of peak hold circuits 126 and 128 is longer than the time constant (attack time) of a low pass filter in a gain control circuit, for example, it is a few milliseconds to a few seconds. A gain control circuit 14 sets the gain coefficient of the sound level adjusting circuit 11 so that the dynamic range of the first sound signal ch0 (the level difference between the maximum sound and the minimum sound) that is outputted to the delay circuit 1 is a predetermined value or below based on the level of the first sound signal ch0 measured at the measuring circuit 9. Similarly, a gain control circuit 15 sets the gain coefficient of the sound level adjusting circuit 12 so that the dynamic range of the second sound signal ch1 that is outputted to the delay circuit 3 is a predetermined value or below based on the level of the second sound signal ch1 measured at the measuring circuit 10.

The gain control circuits 14 and 15 have gain tables 129 and 131 in which the gain coefficient is associated with the level of the sound signal and registered. They read and output the gain coefficients in accordance with the levels measured at the measuring circuits 9 and 10. In accordance with the gain tables, the gain control circuits 14 and 15 set the gain coefficients to reduce the dynamic range of the sound signal in such a way that they set a greater gain coefficient at the level of a certain threshold or below whereas they set a smaller gain coefficient at the level greater than the threshold. The gain coefficients outputted from the gain tables 129 and 131 pass through low pass filters 130 and 132, and are set to the sound level adjusting circuits 11 and 12. The time constant (attack time) of the low pass filters that the gain coefficients follow as the level is increased is, for example, a few microseconds to one second.

Figure 9:
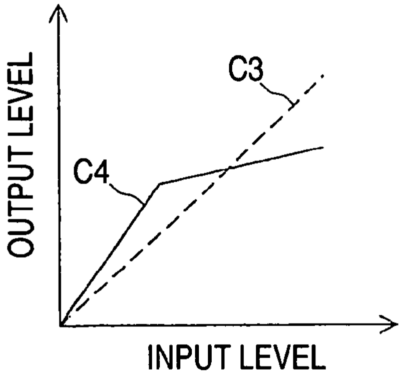
FIG. 9 is a diagram showing the input/output characteristic of a sound level adjusting circuit which is controlled by a gain control circuit in the fourth embodiment of the invention.

Consequently, the input/output characteristics of the sound level adjusting circuits 11 and 12 become the characteristic that compresses the dynamic ranges of the sound signals ch0 and ch1 to be outputted from the sound level adjusting circuits 11 and 12 to the delay circuits 1 and 3. The input/output characteristics of the sound level adjusting circuits 11 and 12 controlled at the gain control circuits 14 and 15 are shown in FIG. 9. In FIG. 9, C3 is an input/output characteristic when the dynamic range of the sound signal is not compressed, and C4 is an input/output characteristic when the dynamic range of the sound signal is compressed as in the embodiment.

When the levels of the sound signals ch0 and ch1 are changed, the gain coefficients to be set to the sound level adjusting circuits 11 and 12 are changed as well. However, when the gain coefficient is changed instantaneously in accordance with a level change, an unnatural feeling is given in audibility. Then, the gain control circuits 14 and 15 vary the gain coefficients at a certain time constant with respect to the level change.

The operation of the sound level adjusting circuits 11 and 12 after the gain coefficients are set, and the operation of the array speaker unit formed of the delay circuits 1 and 3, the multipliers 2 and 4, the adder 5, the amplifier 6 and the speaker unit 7 are the same as those in the first embodiment.

As described above, according to the embodiment, the gain coefficients of the sound level adjusting circuits 11 and 12 are set so that the dynamic ranges of the sound signals ch0 and ch1 to be outputted to the array speaker unit have a predetermined value or below. Thus, the dynamic ranges of each item of contents can be aligned. In addition, problems can be relaxed that when the target sounds reach a low sound level, the sounds are lost in other sounds and the target sounds cannot be heard, and that when the target sounds reach at a louder sound level, the sounds interfere with listening to other sounds and the other sounds cannot be heard. Therefore, in the embodiment, the separation of audibility for the sound signals ch0 and ch1 can be improved, individual viewers can excellently listen to the sounds desired to hear.

Fifth Embodiment

Figure 10:
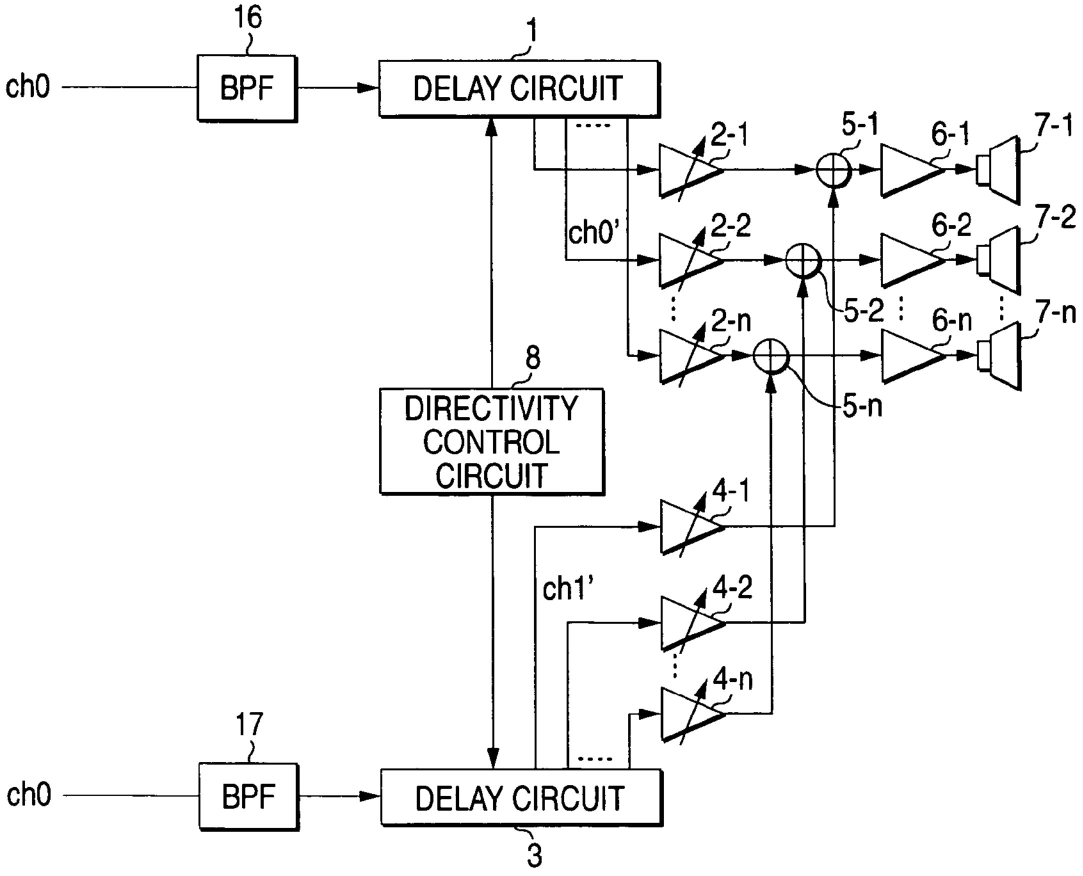
FIG. 10 is a block diagram showing the configuration of an audio output apparatus according to a fifth embodiment of the invention.

Next, a fifth embodiment of the invention will be described. FIG. 10 is a block diagram showing the configuration of an audio output apparatus according to the fifth embodiment of the invention, and the same numerals and signs are designated to the same configuration as that shown in FIG. 2. In the audio output apparatus according to the embodiment, the input of an array speaker unit formed of delay circuits 1 and 3, multipliers 2 and 4, an adder 5, an amplifier 6 and a speaker unit 7 is provided with band pass filters 16 and 17 which are a frequency control module to limit the frequency band of a sound signal.

The first sound signal ch0 is inputted to the band pass filter 16, and the second sound signal ch1 is inputted to the band pass filter 17. The sound signals ch0 and ch1 are band-limited by the band pass filters 16 and 17, respectively, and for example, low audio frequency components equal to a few hundreds Hz or below and high audio frequency components higher than a few kHz are suppressed.

The first sound signal ch0 having passed through the band pass filter 16 is inputted to the delay circuit 1, and the second sound signal ch1 having passed through the band pass filter 17 is inputted to the delay circuit 3.

The operation of the array speaker unit formed of the delay circuits 1 and 3, the multipliers 2 and 4, the adder 5, the amplifier 6 and the speaker unit 7 are the same as that in the first embodiment.

In the embodiment, by providing the band pass filters 16 and 17 to the input of the array speaker unit, the sound signals ch0 and ch1 are outputted to the array speaker unit after the low audio frequency components equal to a few hundreds Hz or below that are difficult for directivity control are suppressed. Therefore, the directivity of individual sounds can be enhanced that are emitted from the array speaker unit in accordance with the sound signals ch0 and ch1. In addition, by providing the band pass filters 16 and 17 to the input of the array speaker unit, the sound signals ch0 and ch1 are outputted to the array speaker unit after the high audio frequency components that cause generation of a grating lobe and a side lobe in a directivity pattern are suppressed. Therefore, the generation of a grating lobe and a side lobe can be suppressed in the directivity pattern of individual sounds emitted from the array speaker unit in accordance with the sound signals ch0 and ch1. Consequently, a problem can be relaxed that the low audio frequency components and the high audio frequency components of the sounds emitted from the array speaker unit in desired directivities are heard louder as well in the direction other than the desired direction.

In addition, in the embodiment, in addition to a physical advantage that the separation is improved because of excellent directivity control, the frequency band of a few kHz that is excellent in directivity control is matched with the formant band. Therefore, this band is relatively emphasized with respect to the low audio frequencies and the high audio frequencies to improve the clarity of human language, allowing easily focusing on the target sounds of contents. Thus, it can be expected to improve the separation psychologically.

In addition, in the embodiment, the band pass filters are used. However, an equalizer (emphasis module) may be used which emphasizes the level of the frequency band of excellent directivity control instead of the band pass filters. Therefore, the same advantage can be obtained as similar to the case in which the band pass filters are used.

In addition, when the characteristics of the band pass filter and the equalizer are optimized for each sound, a more excellent advantage can be expected. For example, since the usages of the vowels and the consonants are greatly different between Japanese language and European and American languages, frequency characteristic correction curves optimum to improved clarity are slightly different. Then, the characteristics of the band pass filter and the equalizer are optimized to individual languages, and thus the clarity of each language can be improved.

Sixth Embodiment

Figure 11:
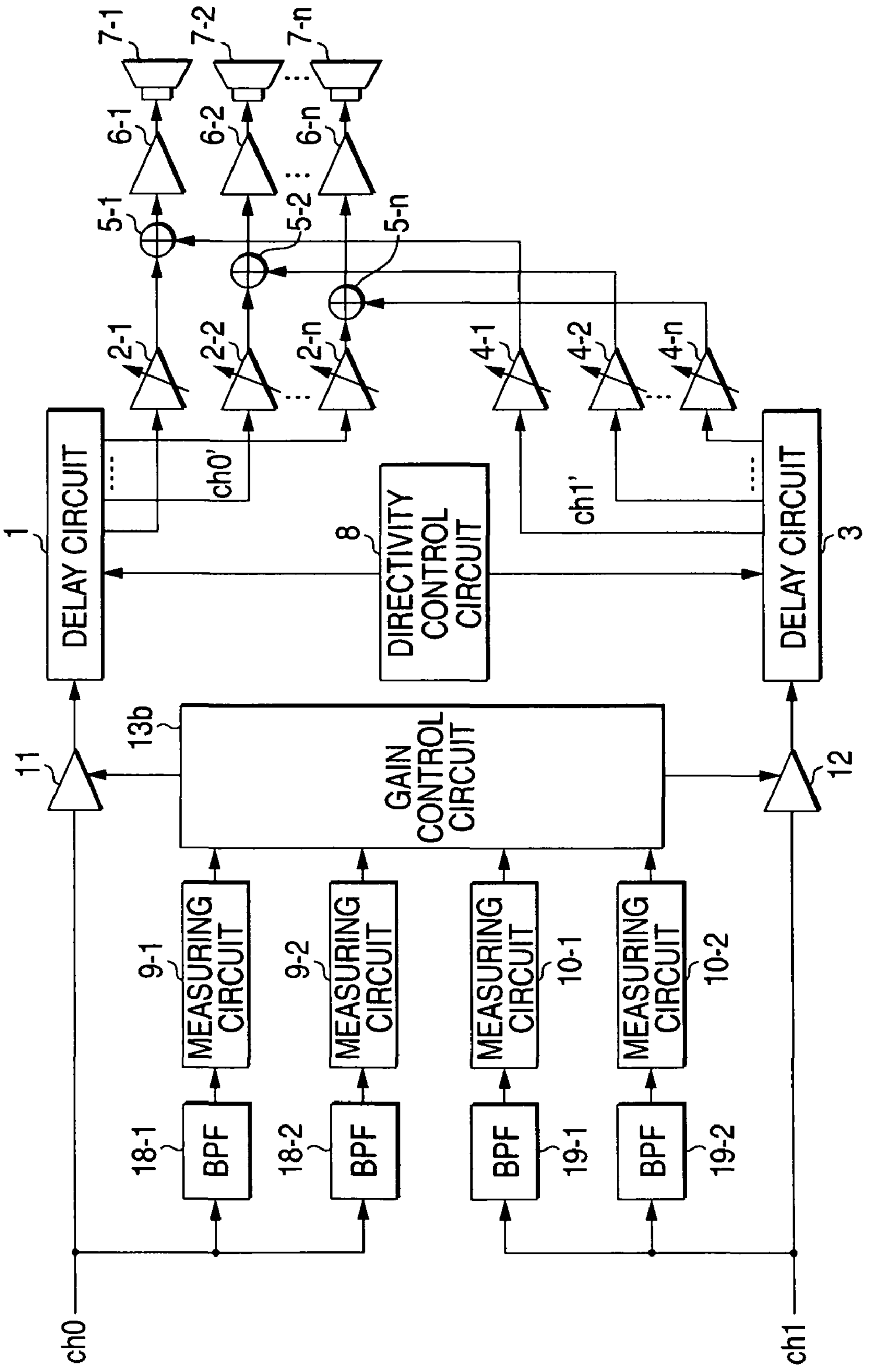
FIG. 11 is a block diagram showing the configuration of an audio output apparatus according to a sixth embodiment of the invention.

Next, a sixth embodiment of the invention will be described. FIG. 11 is a block diagram showing the configuration of an audio output apparatus according to the sixth embodiment of the invention, and the same numerals and signs are designated to the same configuration as that shown in FIG. 2. A measuring module is configured of band pass filters 18-1, 18-2, 19-1 and 19-2 and measuring circuits 9-1, 9-2, 10-1 and 10-2.

The band pass filter 18-1 extracts middle to high audio frequencies of a few kHz or above, for example, from the first sound signal ch0, and the band pass filter 18-2 extracts low audio frequencies lower than those frequencies. Similarly, the band pass filter 19-1 extracts middle to high audio frequencies from the second sound signal ch1, and the band pass filter 19-2 extracts low audio frequencies.

The measuring circuits 9-1 and 9-2 at any time measure the levels of the middle to high audio frequencies and the low audio frequencies of the sound signal ch0, respectively, and the measuring circuits 10-1 and 10-2 measure the levels of the middle to high audio frequencies and the low audio frequencies of the sound signal ch1, respectively.

A gain control circuit 13*b* assigns weights on the levels of the individual frequency bands measured at the measuring circuits 9-1, 9-2, 10-1 and 10-2 with the weight for each of predetermined frequency bands, combine the levels of the weighted individual frequency bands for each of sound signals, and determine the levels of the sound signals ch0 and ch1. Then, the gain control circuit 13*b* sets the gain coefficients of sound level adjusting circuits 11 and 12 so as to equal the levels of the sound signals ch0 and ch1 outputted to delay circuits 1 and 3 based on the difference between the level of the sound signal ch0 and the level of the sound signal ch1 thus determined. The weight for each of the frequency bands is determined depending on the difference of audibility sensitivity in each of the bands for viewers. For example, the weight is set in such a way that it is great in the middle audio frequencies of a few kHz in high audibility sensitivity whereas it is small in the low audio frequencies.

As described above, in the embodiment, the sound signals ch0 and ch1 are separated into a plurality of the frequency bands to measure the levels, the measured levels of the individual frequency bands are assigned with weights by the weight for each of the frequency bands, and the gain coefficients of the sound level adjusting circuits 11 and 12 are set based on the weighted levels of the individual frequency bands. The assigning of weights for each of the frequency bands described above increases the level of the sound signal determined at the gain control circuit 13*b* when the level of the middle audio frequencies of a few kHz is high even though the average level of the all frequency bands is not great. Therefore, the gain coefficient of the sound signal is made small.

The level of psychological audibility of a viewer is varied depending on the frequency band. In the embodiment, an improved separation can be expected by matching the levels of psychological audibility, not matching absolute levels of the sound signals ch0 and ch1 with each other.

Seventh Embodiment

Figure 12:
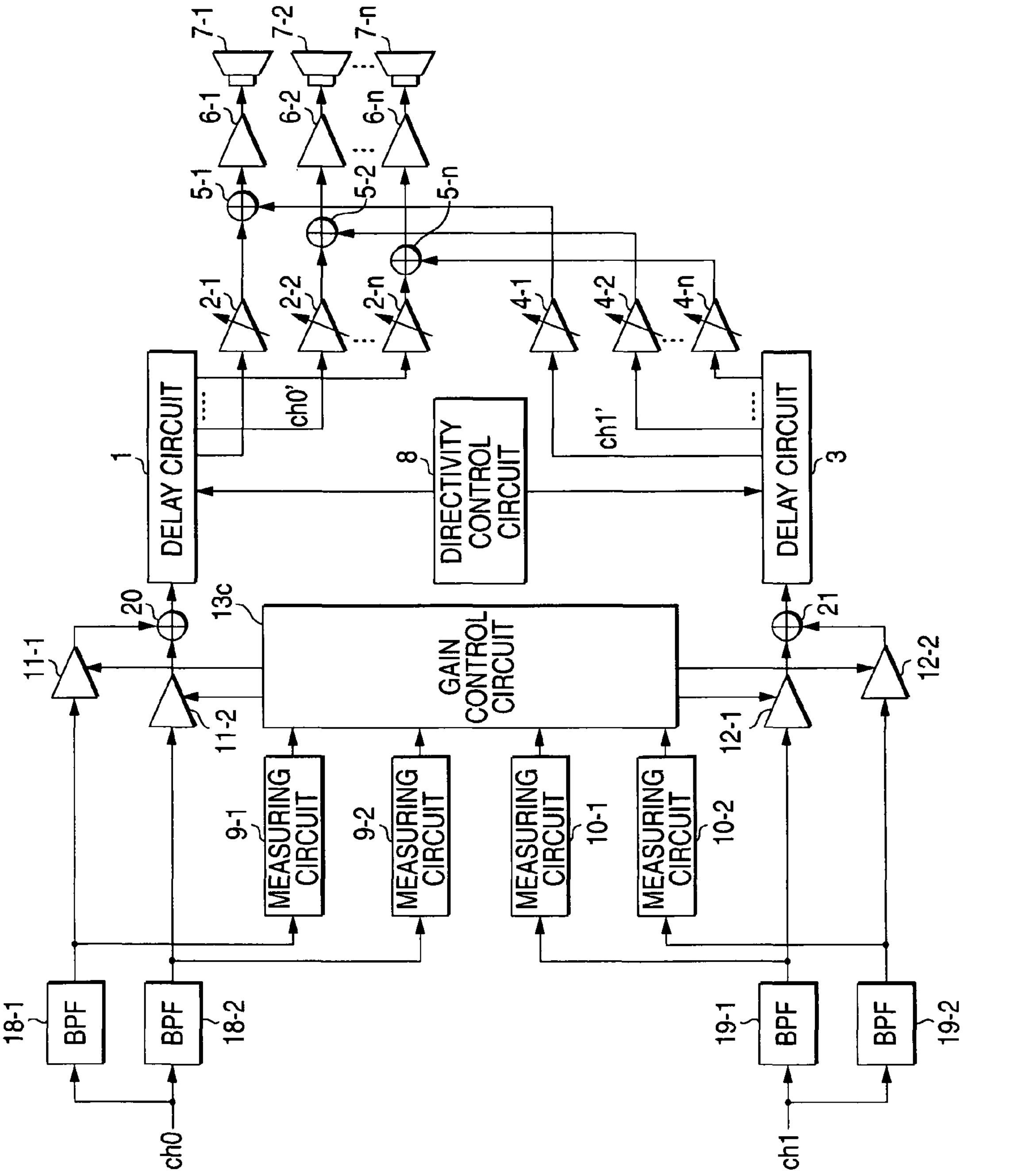
FIG. 12 is a block diagram showing the configuration an audio output apparatus according to a seventh embodiment of the invention.
Figure 13:
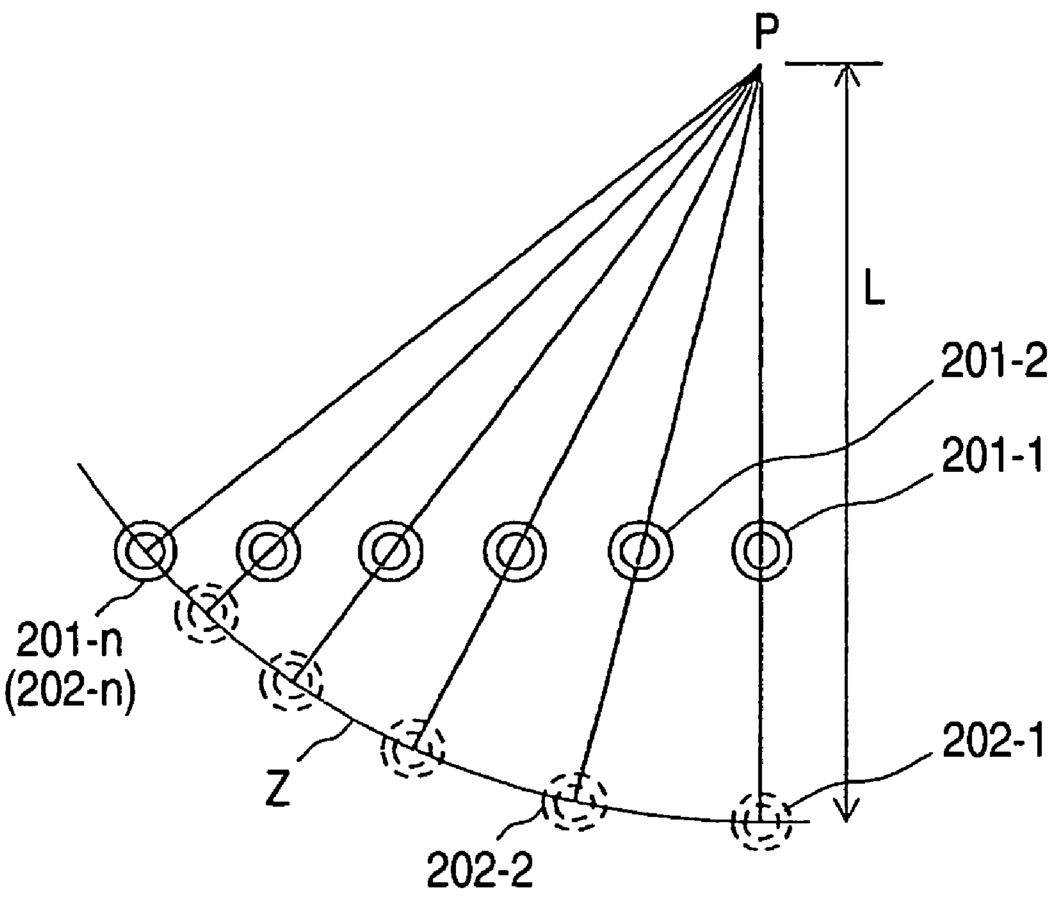
FIG. 13 is a diagram illustrative of the principle of the array speaker.
Figure 14:
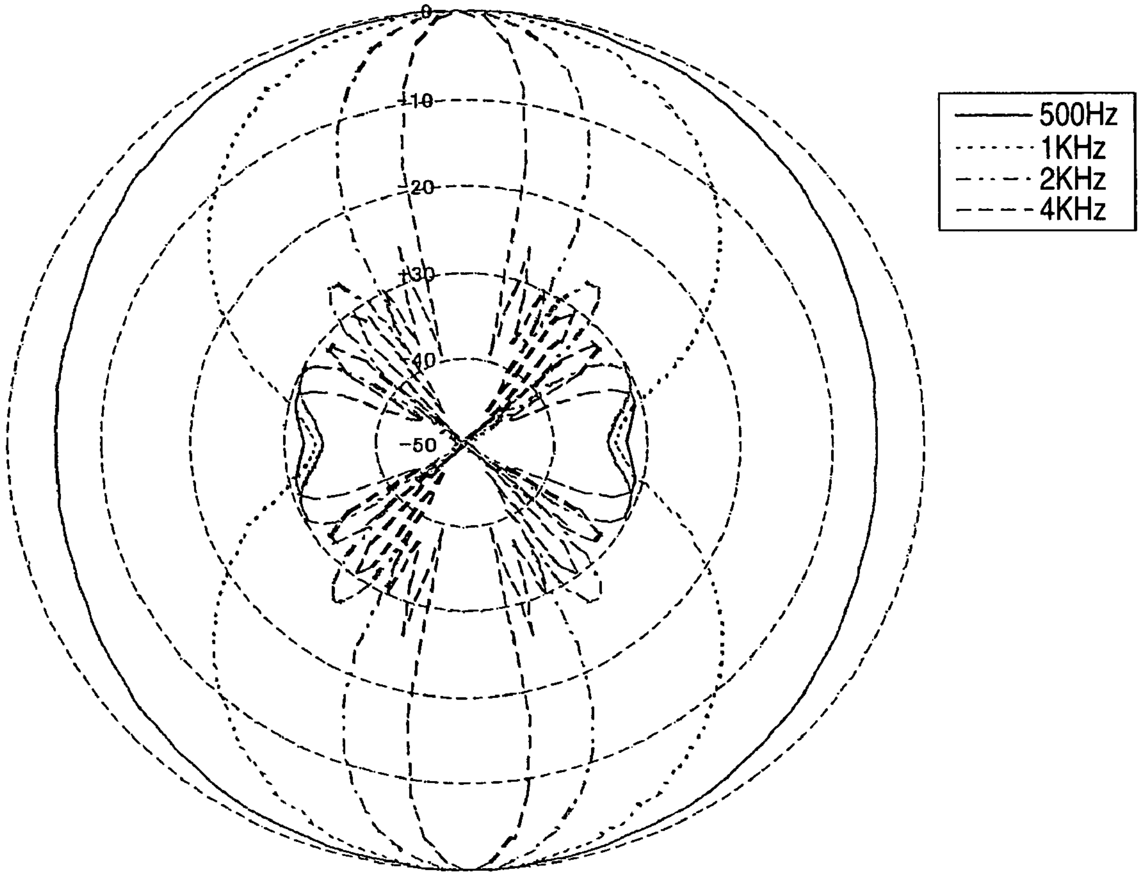
FIG. 14 is a diagram showing an exemplary polar pattern.

Next, a seventh embodiment of the invention will be described. FIG. 12 is a block diagram showing the configuration of an audio output apparatus according to the seventh embodiment of the invention, and the same numerals and signs are designated to the same configuration as that shown in FIG. 11. A sound level adjusting module is configured of sound level adjusting circuits 11-1, 11-2, 12-1 and 12-2, adders 20 and 21 and a gain control circuit 13*c*.

The gain control circuit 13*c* according to the embodiment sets the gain coefficients of the sound level adjusting circuits 11-1, 11-2, 12-1 and 12-2 for each of the frequency bands so as to equal the levels of the sound signals ch0 and ch1 outputted to delay circuits 1 and 3 based on the level difference in the individual frequency bands between the sound signals ch0 and ch1 measured at the measuring circuits 9-1, 9-2, 10-1 and 10-2.

The sound level adjusting circuits 11-1 and 11-2 multiply the middle to high audio frequencies and the low audio frequencies of the sound signal ch0 inputted from band pass filters 18-1 and 18-2 by the gain coefficient for the middle to high audio frequencies and the gain coefficient for the low audio frequencies set by the gain control circuit 13*c*, and thus adjust the levels of the middle to high audio frequencies and the low audio frequencies of the sound signal ch0 and output them. Similarly, the sound level adjusting circuits 12-1 and 12-2 multiply the middle to high audio frequencies and the low audio frequencies of the sound signal ch1 inputted from the band pass filters 19-1 and 19-2 by the gain coefficient for the middle to high audio frequencies and the gain coefficient for the low audio frequencies set by the gain control circuit 13*c*, and thus adjust the levels of the middle to high audio frequencies and the low audio frequencies of the sound signal ch1 and output them.

The adder 20 adds the outputs of the sound level adjusting circuits 11-1 and 11-2, and the adder 21 adds the outputs of the sound level adjusting circuits 12-1 and 12-2.

As described above, in the embodiment, the gain coefficients are adjusted so as to equal the levels of the sound signals ch0 and ch1 for each of the frequency bands. Therefore, the masking effect of the sound signals ch0 and ch1 to each other can be worked more effectively, and an improved separation can be expected.

In addition, in the sixth and seventh embodiments, the frequency band of the sound signal is separated into two parts, but it is needless to say that it maybe separated into more than two parts.

In addition, in the first to fourth and sixth and seventh embodiments, the level is measured on the input side of the sound level adjusting circuits 11 and 12, but this scheme may be done in which the levels of the sound signals ch0 and ch1 are measured at the measuring circuit on the output side of the sound level adjusting circuits 11 and 12 and the measurement results are fed back to the gain control circuit.

In addition, in the first to seventh embodiments, two sound signals ch0 and ch1 are processed, but it is needless to say that the sound signals more than two can be processed similarly.

The invention can be adapted to a system which emits a plurality of sounds in different directivities respectively at the same time.

The invention claimed is:

1. An audio output apparatus comprising:

an array speaker unit having a plurality of speaker units;

a measuring unit that measures levels of a plurality of sound signals including a first sound signal for a first sound beam to be produced by the plurality of speaker units and a second sound signal for a second sound beam to be produced by the plurality of speaker units;

a sound level adjusting unit that adjusts gains based on the measured levels so that the plurality of sound signals have equal magnitudes;

a delay unit having a first delay circuit for the first sound signal and a second delay circuit for the second sound signal; and a directivity control circuit that controls a delay setting for each of the first and second delay circuits based on a desired focal position of each of the first and second sound beams to be directed to and a position of each of the plurality of speaker units, to emit the first sound beam from the plurality of speaker units in a first directivity for one listener and to emit the second sound beam from the plurality of speaker units in a second directivity different from the first directivity for another listener, wherein the first sound signal is independent of the second sound signal so that contents of the first sound signal for the first sound beam is different from contents of the second sound signal for the second beam.

2. The audio output apparatus according to claim 1, wherein:

the measuring unit separates the plurality of sound signals into a plurality of frequency bands to measure levels thereof, and the sound level adjusting unit assigns weights on the measured levels of the frequency bands with a predetermined weight for each of the frequency bands and adjusts the gains based on the weighted levels of the individual frequency bands so that the plurality of sound signals are in equal magnitudes.

3. The audio output apparatus according to claim 1, wherein:

the measuring unit separates the plurality of sound signals into a plurality of frequency bands to measure levels thereof, and the sound level adjusting unit adjusts gains so that the plurality of sound signals are made to have equal magnitudes for each of the frequency bands based on the measured levels of the respective frequency bands.

4. The audio output apparatus according to claim 1, wherein the audio output apparatus simultaneously reproduces the first and second sound signals.

5. The audio output apparatus according to claim 1, wherein the sound level adjusting unit adjusts gains of both the first and second sound signals in real time based on the measured levels so that the first and second sound signals have equal magnitudes.

6. An audio output apparatus comprising:

an array speaker unit having a plurality of speaker units;

a measuring unit that measures levels of a plurality of sound signals including a first sound signal for a first sound beam to be produced by the plurality of speaker units and a second sound signal for a second sound beam to be produced by the plurality of speaker units;

a sound level adjusting unit that adjusts gains based on the measured levels so that a level difference between at least first and second sound signals specified by one listener or another listener is made constant among the plurality of sound signals;

a delay unit having a first delay circuit for the first sound signal and a second delay circuit for the second sound signal; and a directivity control circuit that controls a delay setting for each of the first and second delay circuits based on a desired focal position of each of the first and second sound beams to be directed to and a position of each of the plurality of speaker units, to emit the first sound beam from the plurality of speaker units in a first directivity for the one listener and to emit the second sound beam from the plurality of speaker units in a second directivity different from the first directivity for the another listener, wherein the first sound signal is independent of the second sound signal so that contents of the first sound signal for the first sound beam is different from contents of the second sound signal for the second beam.

7. The audio output apparatus according to claim 6, wherein the audio output apparatus simultaneously reproduces the first and second sound signals.

8. An audio output apparatus comprising:

an array speaker unit having a plurality of speaker units;

a measuring unit that measures levels of a plurality of sound signals including a first sound signal for a first sound beam to be produced by the plurality of speaker units and a second sound signal for a second sound beam to be produced by the plurality of speaker units;

a compression unit that compresses a plurality of dynamic ranges of the plurality of sound signals to a predetermined value or below based on the measured levels and outputs a plurality of sound signals after the dynamic ranges are compressed;

a delay unit having a first delay circuit for the first sound signal and a second delay circuit for the second sound signal output from the compression unit; and a directivity control circuit that controls a delay setting for each of the first and second delay circuits based on a desired focal position of each of the first and second sound beams to be directed to and a position of each of the plurality of speaker units, to emit the first sound beam from the plurality of speaker units in a first directivity for one listener and to emit the second sound beam from the plurality of speaker units in a second directivity different from the first directivity for another listener, wherein the first sound signal is independent of the second sound signal so that contents of the first sound signal for the first sound beam is different from contents of the second sound signal for the second beam.

9. The audio output apparatus according to claim 8, wherein the audio output apparatus simultaneously reproduces the first and second sound signals.

10. An audio output apparatus comprising:

an array speaker unit having a plurality of speaker units;

a frequency control unit that limits or emphasizes frequency bands of a plurality of sound signals including a first sound signal for a first sound beam to be produced by the plurality of speaker units and a second sound signal for a second sound beam to be produced by the plurality of speaker units;

a delay unit having a first delay circuit for the first sound signal and a second delay circuit for the second sound signal controlled by the frequency control unit; and a directivity control circuit that controls a delay setting for each of the first and second delay circuits based on a desired focal position of each of the first and second sound beams to be directed to and a position of each of the plurality of speaker units, to emit the first sound beam from the plurality of speaker units in a first directivity for one listener and to emit the second sound beam from the plurality of speaker units in a second directivity different from the first directivity for another listener, wherein the first sound signal is independent of the second sound signal so that contents of the first sound signal for the first sound beam is different from contents of the second sound signal for the second beam.

11. The audio output apparatus according to claim 10, wherein the audio output apparatus simultaneously reproduces the first and second sound signals.

12. An audio output apparatus comprising:

an array speaker unit having a plurality of speaker units;

a measuring circuit that measures levels of a plurality of sound signals including a first sound signal for a first sound beam to be produced by the plurality of speaker units and a second sound signal for a second sound beam to be produced by the plurality of speaker units;

a gain control circuit that refers the measured levels and sets a gain coefficient to each of the plurality of sound signals;

a sound level adjusting circuit that adjusts the levels of the plurality of sound signals based on the set gain coefficient;

a delay unit having a first delay circuit for the first sound signal and a second delay circuit for the second sound signal; and a directivity control circuit that controls a delay setting for each of the first and second delay circuits based on a desired focal position of each of the first and second sound beams to be directed to and a position of each of the plurality of speaker units, to emit the first sound beam from the plurality of speaker units in a first directivity for one listener and to emit the second sound beam from the plurality of speaker units in a second directivity different from the first directivity for another listener, wherein the first sound signal is independent of the second sound signal so that contents of the first sound signal for the first sound beam is different from contents of the second sound signal for the second beam.

13. The audio output apparatus according to claim 12, wherein the gain control unit sets the gain coefficient so that the plurality of the levels of the plurality of sound signals is nearly equal to each other.

14. The audio output apparatus according to claim 12, wherein the gain control unit includes an offset generating circuit that adds a certain amount of an offset amount to at least one level among the measured levels.

15. The audio output apparatus according to claim 12, wherein the gain control unit sets the gain coefficient so that dynamic ranges of the plurality of sound signals input to the array speaker unit are made to have a predetermined value or below.

16. The audio output apparatus according to claim 12, further comprising a band pass filter to which the plurality of sound signals are input to limit a frequency band thereof.

17. The audio output apparatus according to claim 16, wherein each of the plurality of sound signals limited in the frequency band by the band pass filter is output to the measuring circuit.

18. The audio output apparatus according to claim 16, wherein each of the plurality of sound signals limited in the frequency band by the band pass filter is output to the sound level adjusting circuit.

19. The audio output apparatus according to claim 12, wherein the audio output apparatus simultaneously reproduces the first and second sound signals.

* * * * *